United States Patent
Tatsukawa et al.

(10) Patent No.: US 7,128,453 B2
(45) Date of Patent: *Oct. 31, 2006

(54) VEHICULAR HEADLAMP

(75) Inventors: Masashi Tatsukawa, Shizuoka-ken (JP); Hiroyuki Ishida, Shizuoka-ken (JP); Kiyoshi Sazuka, Shizuoka-ken (JP); Tsukasa Tokida, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 133 days.

This patent is subject to a terminal disclaimer.

(21) Appl. No.: 10/776,996

(22) Filed: Feb. 11, 2004

(65) Prior Publication Data

US 2004/0160783 A1    Aug. 19, 2004

(30) Foreign Application Priority Data

Feb. 13, 2003    (JP)    ............................. 2003-035253

(51) Int. Cl.
    *B60Q 1/00*    (2006.01)
(52) U.S. Cl. ................. 362/507; 362/543; 362/544; 362/545; 362/549
(58) Field of Classification Search ........... 362/507, 362/543, 544, 545, 549
    See application file for complete search history.

(56) References Cited

U.S. PATENT DOCUMENTS

| | | | | |
|---|---|---|---|---|
| 4,883,333 A | * | 11/1989 | Yanez ..................... | 385/33 |
| 5,032,960 A | * | 7/1991 | Katoh ..................... | 362/240 |
| 5,397,885 A | * | 3/1995 | Massieu et al. ........ | 235/462.42 |
| 6,254,246 B1 | * | 7/2001 | Tiao et al. .............. | 362/614 |

FOREIGN PATENT DOCUMENTS

| | | |
|---|---|---|
| JP | 6-89601 | 3/1994 |
| JP | 11-232912 | 8/1999 |
| JP | 2001-177156 | 6/2001 |
| JP | 2001-266620 | 9/2001 |
| JP | 2003-31007 | 1/2003 |
| JP | 2003-31011 | 1/2003 |

OTHER PUBLICATIONS

KRPO, Office Action for corresponding KR Application No. 10-2004-0008662, mailed Aug. 26, 2005 (3 pages).
Patent Abstracts of Japan, Publication No. 2001-177156, dated Jun. 29, 2001 (1 page).
Patent Abstracts of Japan, Publication No. 11-232912, dated Aug. 27, 1999 (2 pages).
Patent Abstracts of Japan, Japanese Laid-open Patent Application No. 06-089601 published on Mar. 29, 1994 (1 page).
Patent Abstracts of Japan, Japanese Laid-open Patent Application No. 2001-266620 published on Sep. 28, 2001 (1 page).
Translation of Chinese Office Action in Patent Application No.: 2004100053518, mailed Jan. 6, 2006, 2 pages.
Chinese Office Action in Patent Application 2004100053518, mailed Jan. 6, 2006, 3 pages.
Patent Abstracts of Japan, Publication No.: 2003-031007, Publication Date: Jan. 31, 2003, 2 pages.
Patent Abstracts of Japan, Publication No.: 2003-031011, Publication Date: Jan. 31, 2003, 2 pages.

* cited by examiner

*Primary Examiner*—Sandra O'Shea
*Assistant Examiner*—Mark Tsidulko
(74) *Attorney, Agent, or Firm*—Osha Liang LLP

(57) ABSTRACT

A vehicular headlamp for emitting light toward a predetermined emitting direction, includes: a plurality of semiconductor light emitting devices approximately aligned; and an optical component, having its optical center on one of the semiconductor light emitting devices, for irradiating light emitted by the semiconductor light emitting devices toward the emitting direction.

6 Claims, 12 Drawing Sheets

VEHICULAR HEADLAMP

This patent application claims priority from a Japanese patent application No. 2003-035253 filed on Feb. 13, 2003, the contents of which are incorporated herein by reference.

BACKGROUND OF THE INVENTION

1. Field of the Invention

The present invention relates to a vehicular headlamp. More particularly, the present invention relates to a vehicular headlamp for emitting light toward a predetermined emitting direction. The vehicular headlamp the invention concerns, for example, regular headlamp, fog lamp and cornering lamp for automobiles, trains, motorcycles or the like.

2. Description of the Related Art

A vehicular headlamp for emitting light ahead of an automobile, for example, has to distribute the emitted light in a desired distribution pattern with high precision from safety reasons. That light distribution pattern is formed by means of an optical system using a reflecting mirror, a lens or the like, for example, as disclosed in Japanese Patent Application Publication (Laid-Open) No. 6-89601, pages 3–7 and FIGS. 1–14. In recent years, the use of a semiconductor light emitting device in the vehicular headlamp has been discussed.

In order to obtain sufficient light amount in the vehicular headlamp, a method has been discussed in which a plurality of semiconductor light emitting devices are used. In this case, however, optical design may become more complicated, resulting in difficulty in formation of an appropriate light distribution pattern.

SUMMARY OF THE INVENTION

Therefore, it is an object of the present invention to provide a vehicular headlamp, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular headlamp for emitting light toward a predetermined emitting direction, comprises: a plurality of semiconductor light emitting devices approximately aligned; and an optical component, having its optical center on one of the plurality of semiconductor light emitting devices, operable to irradiate light emitted by the plurality of semiconductor light emitting devices toward the emitting direction.

The plurality of semiconductor light emitting device may be aligned in a predetermined aligning direction; the one semiconductor light emitting device may have a side at an end thereof, the side extending in the aligning direction; and the optical component may have the optical center on the side and may form at least a part of a cut line for defining a boundary between a bright region and a dark region in a light distribution pattern of the vehicular headlamp based on light emitted by a portion near the side of the one semiconductor light emitting device.

The vehicular headlamp may emit the light ahead of an automobile, and the plurality of semiconductor light emitting devices may be aligned in an approximately transverse direction of the automobile.

An odd number of semiconductor light emitting devices may be provided, and the optical component may have the optical center on one of the semiconductor light emitting devices that is positioned at a center of them.

An even number of semiconductor light emitting devices may be provided, the semiconductor light emitting devices being arranged asymmetrically with respect to the optical center of the optical component, and the optical component may form at least a part of a light distribution pattern of the vehicular headlamp based on the light emitted by the semiconductor light emitting devices.

The vehicular headlamp to which the present invention may be applied to includes but not limited to regular headlamp, fog lamp and cornering lamp for automobiles, trains, motorcycles or the like.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
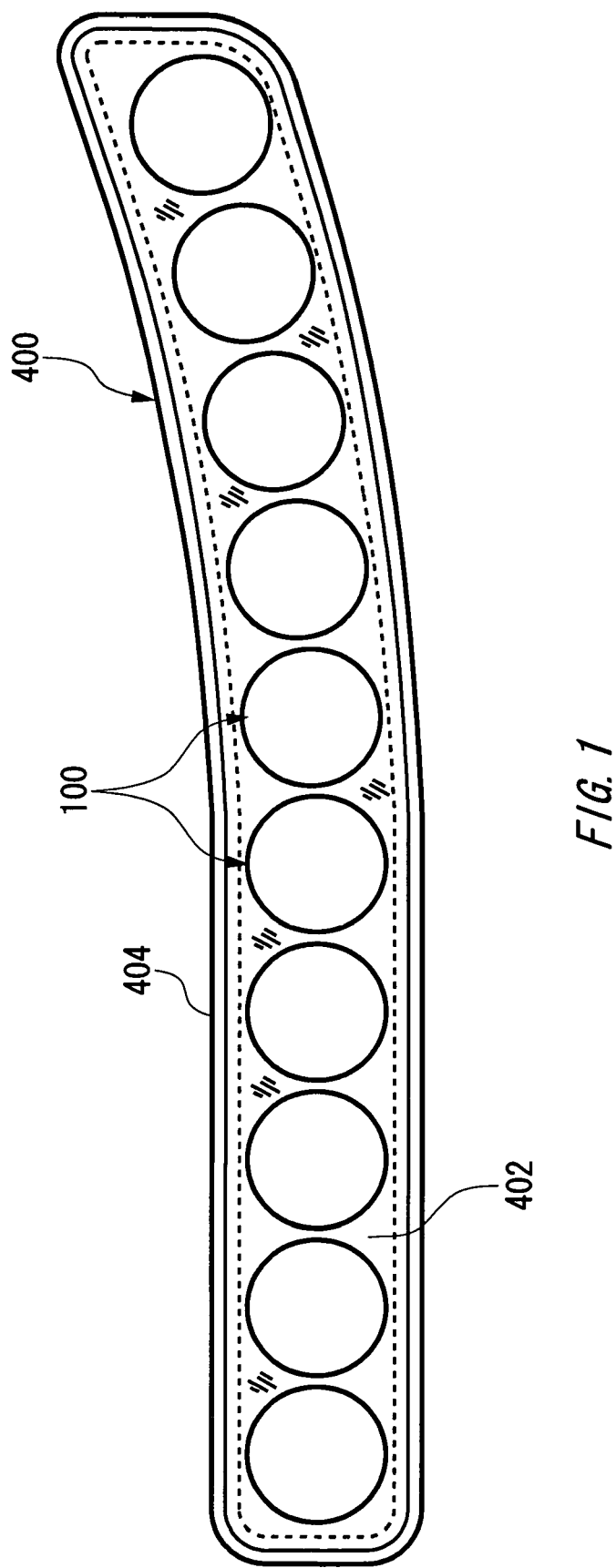
FIG. 1 illustrates an exemplary structure of an automotive lamp according to the present invention.

FIG. 1 illustrates an exemplary structure of an automotive lamp 400 according to an embodiment of the present invention. The automotive lamp 400 is a vehicular headlamp for emitting a low beam that emits light toward a predetermined emitting direction ahead of an automobile. The automotive lamp 400 of this example aims to clearly form a cut line that defines a boundary between a bright region and a dark region in a light distribution pattern of the vehicular headlamp. The automotive lamp 400 accommodates a plurality of light source units 100 approximately aligned in a row within a lamp room formed by a transparent cover 402 and a lamp body 404.

Those light source units 100 have the same or similar structure. The light source units 100 are accommodated in the lamp room in such a manner those optical axes are at a downward angle of about 0.3° to about 0.6° with respect to the front-rear direction of the automobile when the automotive lamp 400 is mounted on the body of the automobile. The automotive lamp 400 forms a predetermined light distribution pattern by emitting light ahead of the automobile based on the light emitted by those light source units 100. The automotive lamp 400 may include a plurality of light source units 100 respectively having different light distribution characteristics.

Figure 2:
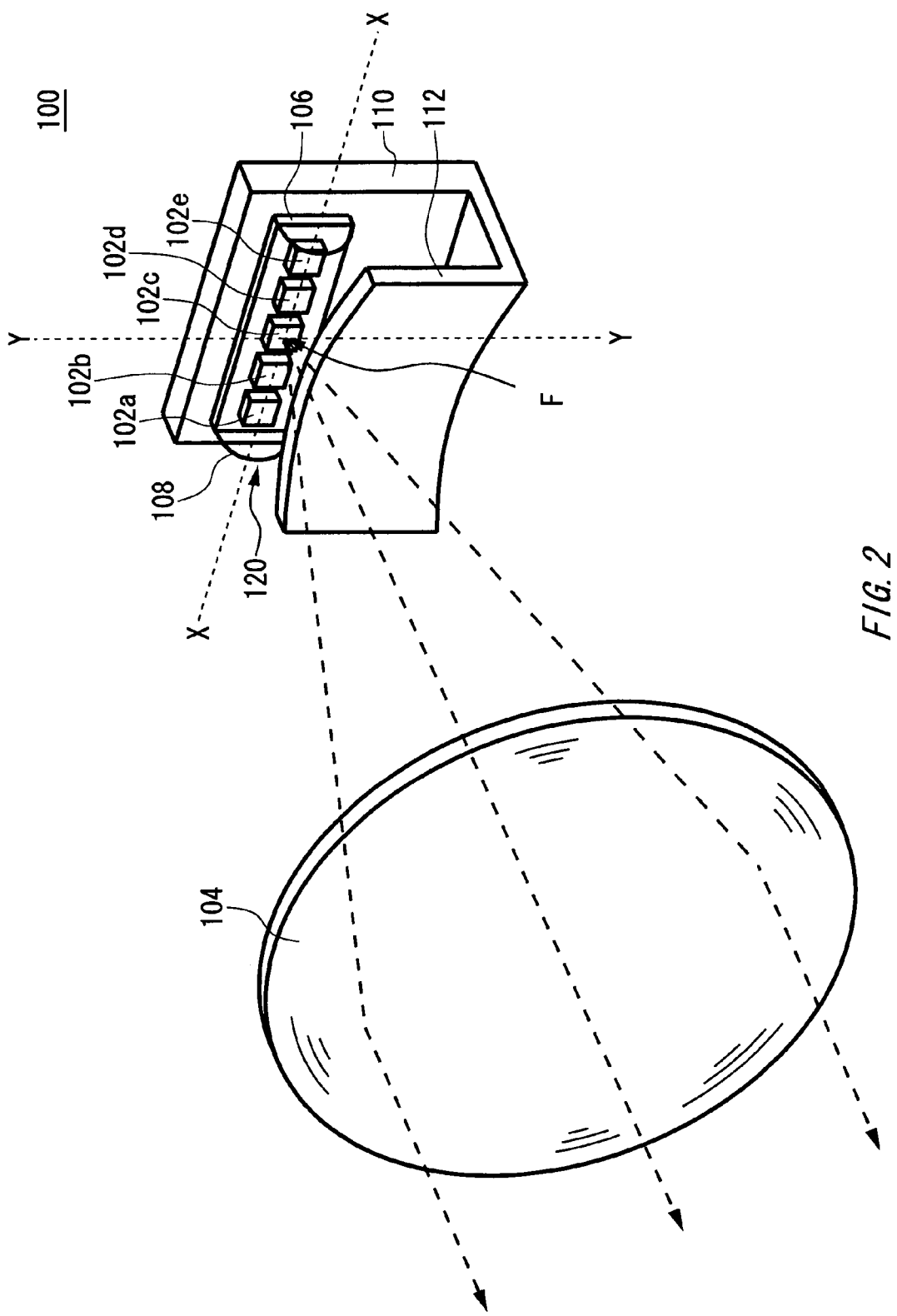
FIG. 2 is a perspective view of an exemplary light source unit.
Figure 3:
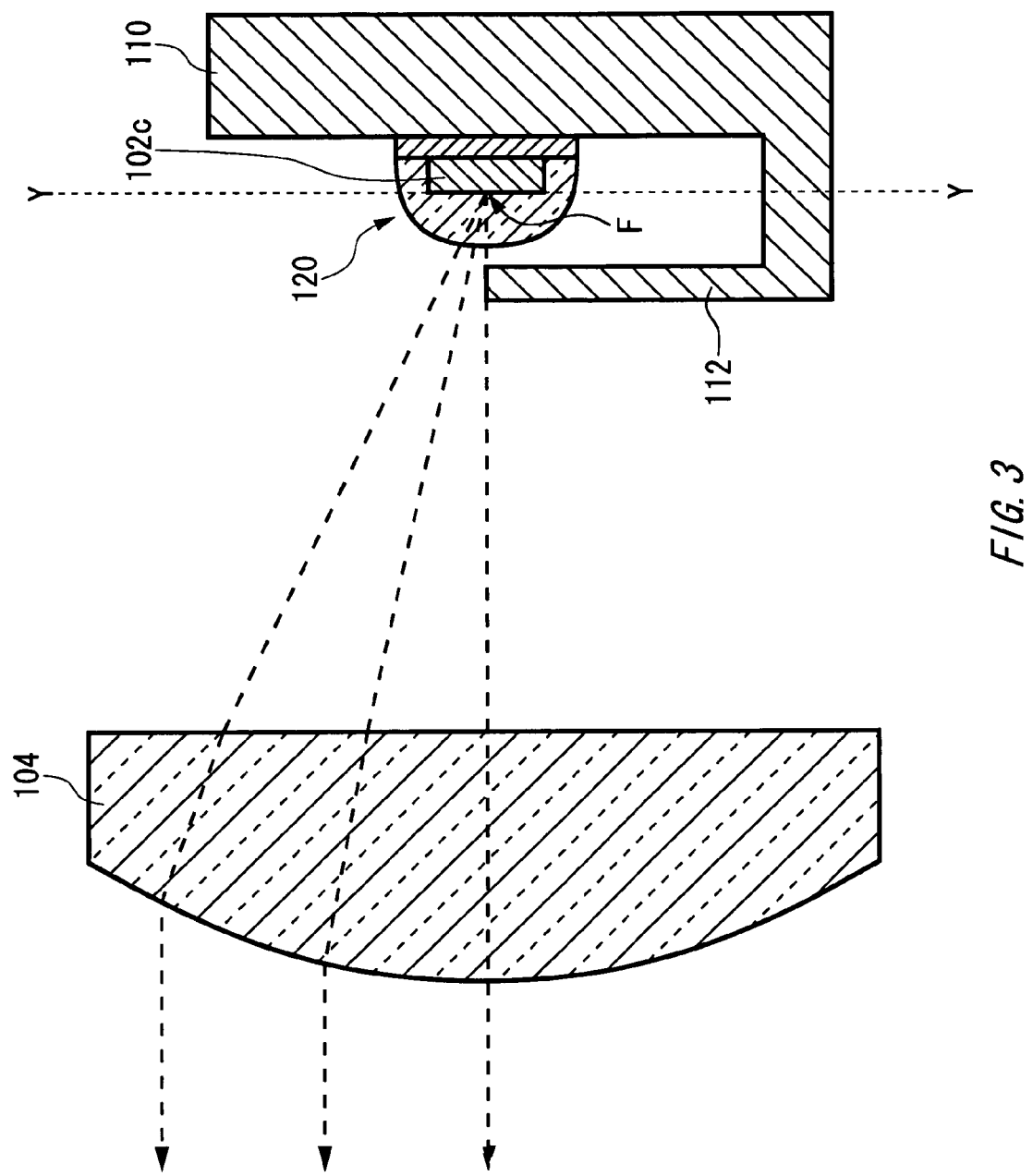
FIG. 3 is a cross-sectional view of the light source unit shown in FIG. 2.

FIGS. 2 and 3 illustrate an exemplary structure of the light source unit 100. FIG. 2 is a perspective view of the light source unit 100, while FIG. 3 is a cross-sectional view thereof cut along a vertical plane parallel to the front-rear direction of the automobile. The light source unit 100 of this example is a projector-type light source unit for emitting light generated by a light source 120 ahead by means of a lens 104, and includes a supporting member 110, a light blocking member 112, the light source 120 and the lens 104.

The supporting member 110 is a plate-like member that supports the bottom surface of the light source 120 on its surface facing ahead of the automobile so as to fix the light source 120, so that the light source 120 is allowed to emit light ahead of the automobile. Moreover, in this example, the supporting member 110 is arranged to stand vertically. Thus, the supporting member 110 has a function of a heat sink that radiates heat generated by the light source 120. In this manner, it is possible to prevent reduction of light intensity of the light source 120 caused by the generated heat.

The light blocking member 112 is a plate-like member provided to be opposed to the surface of the supporting member 110 with a part of the light source 120 sandwiched therebetween, and blocks a part of light generated by the light source 120 by covering the part of the light source 120 from the automobile-front side of the light source 120, that is a closer side to the front of the automobile.

In this example, the light blocking member 112 blocks a part of the light generated by the light source 120 at its upper edge, thereby defining a boundary between a bright region and a dark region of light incident on the lens 104 based on the shape of the upper edge projected straight ahead of the upper edge. That projected shape of the upper edge is in form of a straight line extending in the approximately left-right direction of the automobile. That projected shape maybe a shape with both ends turned down. In this example, the shape of the light blocking member 112 seen from above is such a shape that the light blocking member 112 crosses the light source unit 100 along the approximately transverse direction of the automobile while being curved backward at its center.

In this example, the lower end of the light blocking member 112 is connected to the lower end of the supporting member 110, as shown in FIG. 2, and they are formed integrally with each other. Therefore, the light blocking member 112 receives heat generated by the light source 120 from the supporting member 110. In this manner, the light blocking member 112 has a function of a heat sink for radiating that heat.

The light source 120 includes a plurality of semiconductor light emitting devices 102a–102e approximately aligned in a predetermined aligning direction. In this example, the light source 120 includes an odd number of semiconductor light emitting devices 102a–102e aligned in the approximately transverse direction of the automobile. Each of the semiconductor light emitting devices 102a–102e may be arranged in such a manner that the side at the lower end thereof extending in the approximately transverse direction is approximately aligned with the upper edge of the upper edge of the light blocking member 112.

The lens 104 is an exemplary optical component provided commonly to a plurality of semiconductor light emitting devices 102a–102e. The lens 104 is arranged on the automotive-front side of the semiconductor light emitting devices 102a–102e, and transmits light emitted by those semiconductor light emitting devices 102a–102e, thereby irradiating that light toward the emitting direction ahead of the automobile.

The lens 104 has an optical center F, that is a focus, a reference point in optical design or the like, on one of the odd number of semiconductor light emitting devices 102a–102e which is positioned at the center of them, i.e., the semiconductor light emitting device 102c. In this example, the lens 104 has its optical center F on the intersection of X-axis and Y-axis. The X-axis and the Y-axis pass through the center of the surface of the semiconductor light emitting device 102c and the X-axis extends along the transverse direction of the automobile while the Y-axis extending vertically. In this case, it is possible to appropriately form the light distribution pattern having a symmetrical region. Moreover, since the semiconductor light emitting device 102c is arranged near the optical center F of the lens 104, the light source unit 100 can emit light that is controlled with high precision ahead.

The lens 104 may have its optical center F in a predetermined area on the semiconductor light emitting device 102c that is set to correspond to the precision required for formation of the cut line. For example, the lens 104 may have its optical center F on a position at the upper edge of the light blocking member 112 that is positioned in front of the semiconductor light emitting device 102c.

Moreover, the lens 104 may have its optical center F on the side at the lower end of the semiconductor light emitting device 102c extending in the lateral direction thereof. In this case, the lens 104 can clearly form the boundary between the bright region and the dark region corresponding to that side of the semiconductor light emitting device 102c ahead of the automobile by projecting an image of a region near that side of the semiconductor light emitting device 102c.

The lens 104 may form at least a part of the cut line in the light distribution pattern of the automotive lamp 400 (see FIG. 1) based on light generated by the region near that side of the semiconductor light emitting device 102c, for example. The lens 104 may direct the light generated by the semiconductor light emitting device 102c to a region to be irradiated with light having especially higher illuminance, i.e., a so-called hot zone, near the cut line. In this case, the automotive lamp 400 can form the clear and appropriate cut line.

In an alternative example, the lens 104 may have its optical center F on any of other semiconductor light emitting devices 102a, 102b, 102d and 102e. Also in this case, the automotive lamp 400 can form the clear cut line by irradiating the region near the cut line with light appropriately.

Figure 4:
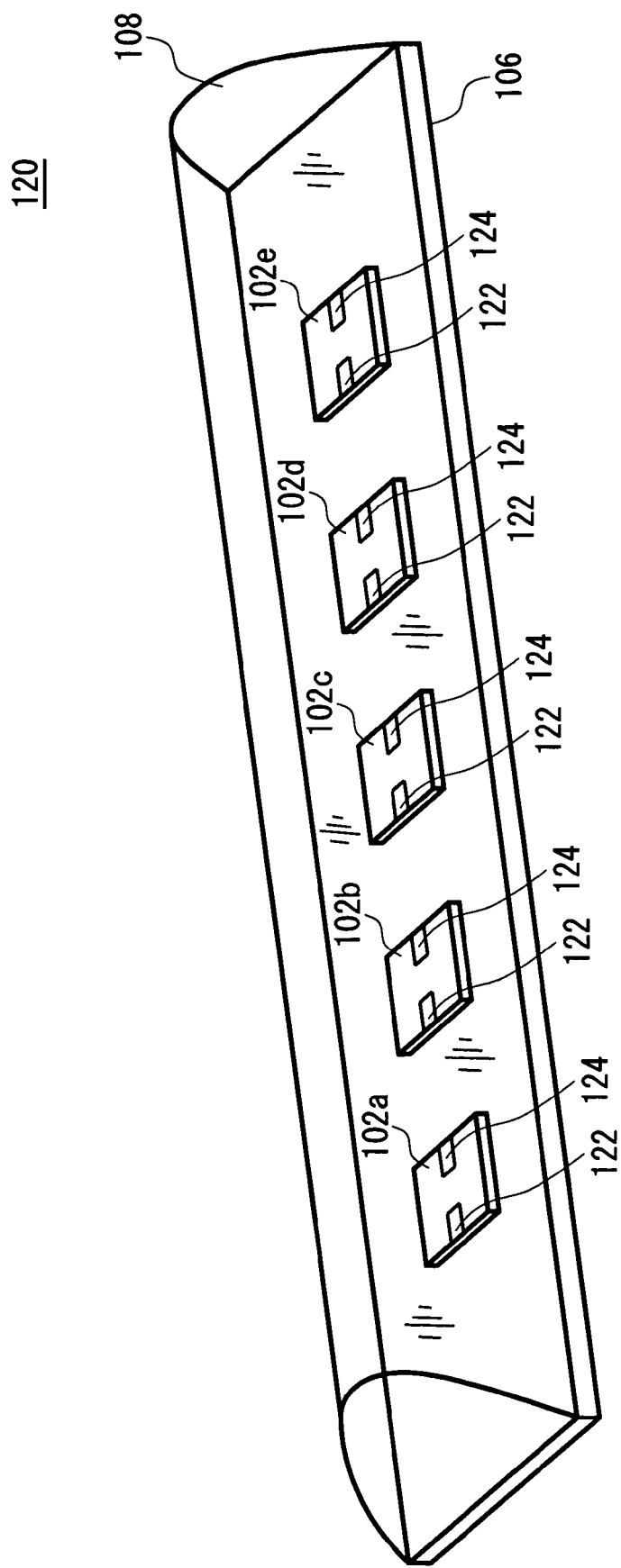
FIG. 4 shows an exemplary structure of a light source in detail.

FIG. 4 illustrates an exemplary detailed structure of the light source 120. The light source 120 of this example is a linear light source extending in the approximately transverse direction of the automobile, and includes a substrate 106, a plurality of semiconductor light emitting devices 102a–102e and a light transmitting member 108. The substrate 106 fixes a plurality of semiconductor light emitting devices 102a–102e placed on its upper surface.

The semiconductor light emitting devices 102a–102e are light emitting diodes, for example, and are approximately aligned at approximately constant intervals on the substrate 106. The semiconductor light emitting device 102 irradiates phosphors (not shown) provided on its surface with ultraviolet light so as to cause the phosphors to emit white light, for example. Alternatively, the semiconductor light emitting device may irradiate the phosphors with blue light so as to cause the phosphors to emit yellow light that is light of a complementary color of blue. In this case, the light source 120 emits white light based on the blue light and the yellow light respectively emitted by the semiconductor light emitting device and the phosphors.

In this example, each of a plurality of semiconductor light emitting devices 102a–102e has a positive electrode 122 and a negative electrode 124 on its surface. The positive electrode 122 and the negative electrode 124 are provided to correspond to a P-type semiconductor layer and an N-type semiconductor layer (both not shown) in the semiconductor light emitting device 102, respectively, and receive power for generating light. The positive electrode 122 and the negative electrode 124 may be provided near a side substantially perpendicular to the aligning direction in which a plurality of semiconductor light emitting devices 102a–102e are arranged. In this case, the effect of the shape of the positive electrode 122 or negative electrode 124 on the formation of the cut line can be reduced.

Moreover, a plurality of semiconductor light emitting devices 102a–102e may be electrically connected in series by wirings (not shown) provided in the light source 120. In this case, the current flowing through the semiconductor light emitting devices 102a–102e can be made uniform. Alternatively, the semiconductor light emitting devices 102a–102e may be electrically connected in parallel. In this case, the voltage to be supplied to the light source can be reduced.

The light transmitting member 108 is formed from material that can transmit light emitted by the semiconductor light emitting device 102, such as transparent resin, and seals a plurality of semiconductor light emitting devices 102a–102e by being formed to be opposed to the substrate 106 with those semiconductor light emitting devices 102a–102e sandwiched therebetween. According to this example, it is possible to appropriately form the light source 120 using a plurality of semiconductor light emitting devices 102a–102e.

Figure 5:
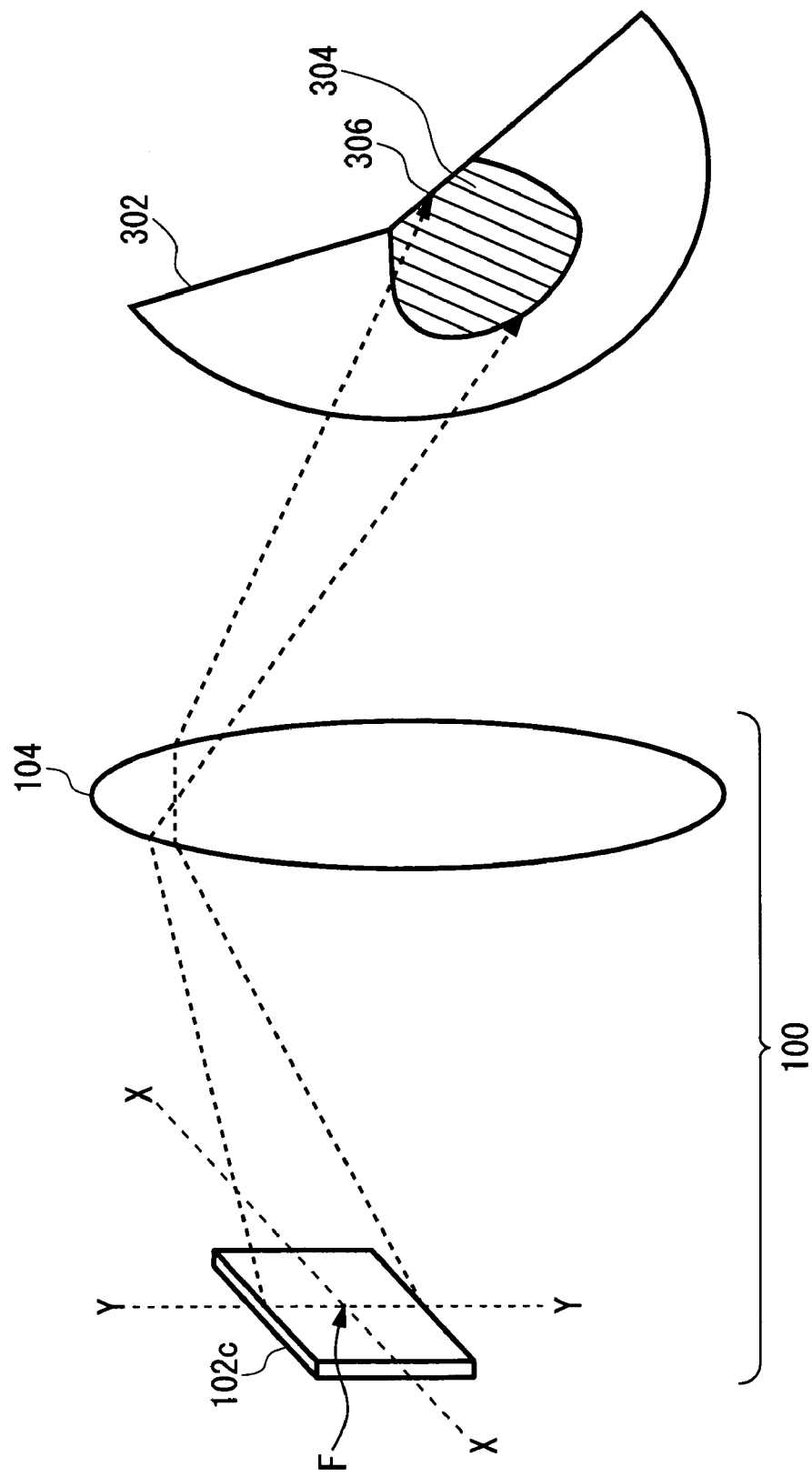
FIG. 5 is a conceptual diagram of an exemplary light distribution pattern.

FIG. 5 is a conceptual diagram of an exemplary light distribution pattern 302 formed by the light source unit 100. The light distribution pattern 302 is a light distribution pattern of a low beam formed on a virtual vertical screen arranged at a position 25 meters ahead of the light source unit 100.

According to this example, the lens 104 forms the light distribution pattern 302 having a predetermined shape by projecting light emitted by a plurality of semiconductor light emitting devices 102a–102e (see FIG. 2) onto the virtual vertical screen. The lens 104 forms a cut line in the light distribution pattern 302 based on the shape of the upper edge of the light blocking member 112 (see FIG. 2). For example, the lens 104 irradiates light emitted by the semiconductor light emitting device 102c to a region 304 that is a part of the light distribution pattern 302. In this case, the lens 104 may form a boundary 306 of the region 304 on the cut line of the light distribution pattern 302 in accordance with the side at the lower end of the semiconductor light emitting device 102c.

As described referring to FIG. 2, the lens 104 has its optical center F on the semiconductor light emitting device 102c. In this case, the lens 104 clearly projects the boundary 306 to a region near the hot zone around the center of the light distribution pattern 302. Thus, it is possible to clearly form the cut line of the light distribution pattern 302.

The lens 104 may form a portion in the cut line in the light distribution pattern 302, other than the boundary 306, in accordance with the sides at the lower ends of the semiconductor light emitting devices 102a, 102b, 102d and 102e, for example. In this case, it is possible to clearly form the cut line in the light distribution pattern 302 because those sides at the lower ends are positioned in a focal plane of the lens 104.

In an alternative example, the automotive lamp 400 (see FIG. 1) may form the light distribution pattern 302 based on light generated by a plurality of light source units 100 respectively having different light distribution characteristics. In this case, each of those light source units 100 may irradiate a region that is a part of the light distribution pattern 302 with light.

Figure 6:
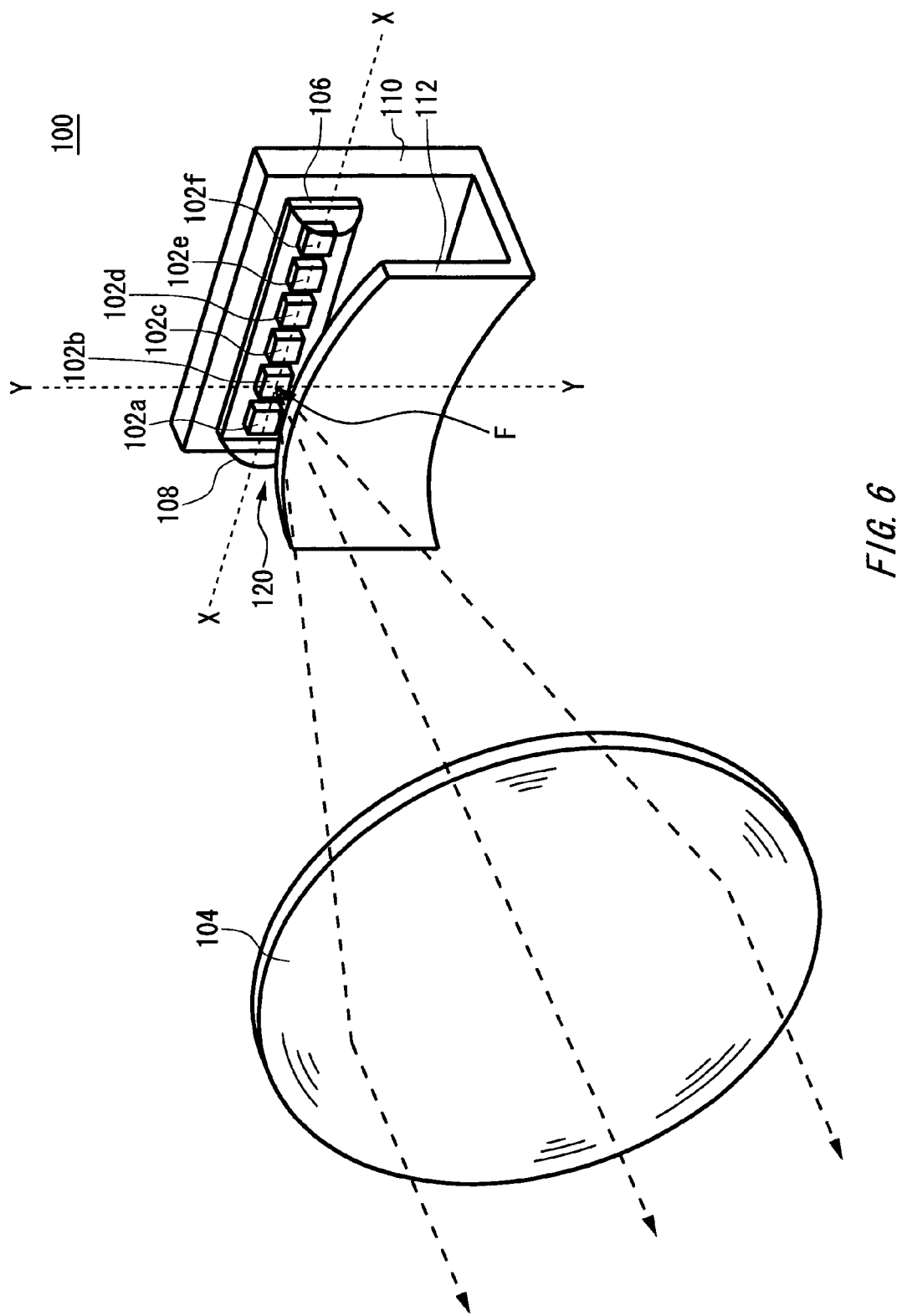
FIG. 6 shows the structure of another exemplary light source unit.

FIG. 6 shows another exemplary structure of the light source unit 100. In this example, the light source 120 includes an even number of semiconductor light emitting devices 102a–102f arranged in the approximately transverse direction of the automobile. The even number of semiconductor light emitting devices 102a–102f are arranged asymmetrically with respect to the optical center F of the lens 104. In this case, the lens 104 forms at least a part of the light distribution pattern of the automotive lamp 400 (see FIG. 1) based on light emitted by those semiconductor light emitting devices 102a–102f thus arranged.

The lens 104 has its optical center F near the semiconductor light emitting device 102b. In this example, the lens 104 has its optical center F on the intersection of X-axis and Y-axis both running through the center of the surface of the semiconductor light emitting device 102b, X-axis extending in the transverse direction of the automobile while Y-axis extending vertically, as shown in FIG. 6. The lens 104 irradiates light ahead of the automobile on the left based on light generated by two semiconductor light emitting devices 102a and 102b and irradiates light of higher intensity ahead of the automobile on the right based on light emitted by the remaining four semiconductor light emitting devices 102c–102f, for example.

It should be noted that in some cases the vehicular headlamp is required to have a light distribution pattern in which either of right and left sides of the automobile has to be irradiated with light of higher intensity, in accordance with a manner in which automobiles pass by each other that is determined by a law or the like. According to this example, it is possible to form an appropriate light distribution pattern. Please note that the light blocking member 112 is curved toward the rear of the automobile in such a manner that a portion of the light blocking member 112 near the semiconductor light emitting device 102b is the closest to the rear of the automobile.

In this example, the automotive lamp 400 may further include a light source unit in addition to the aforementioned light source units 100, which has light distribution characteristics from those of the light source units 100. In this case, the automotive lamp 400 may form a desired light distribution pattern based on light emitted by a plurality of light source units respectively having different light distribution characteristics. According to this example, it is possible to appropriately form various light distribution patterns. Except for the above, the components in FIG. 6 having the same reference numerals as those in FIG. 2 have the same or similar functions as/to the components in FIG. 2 and therefore the description thereof is omitted.

Figure 7:
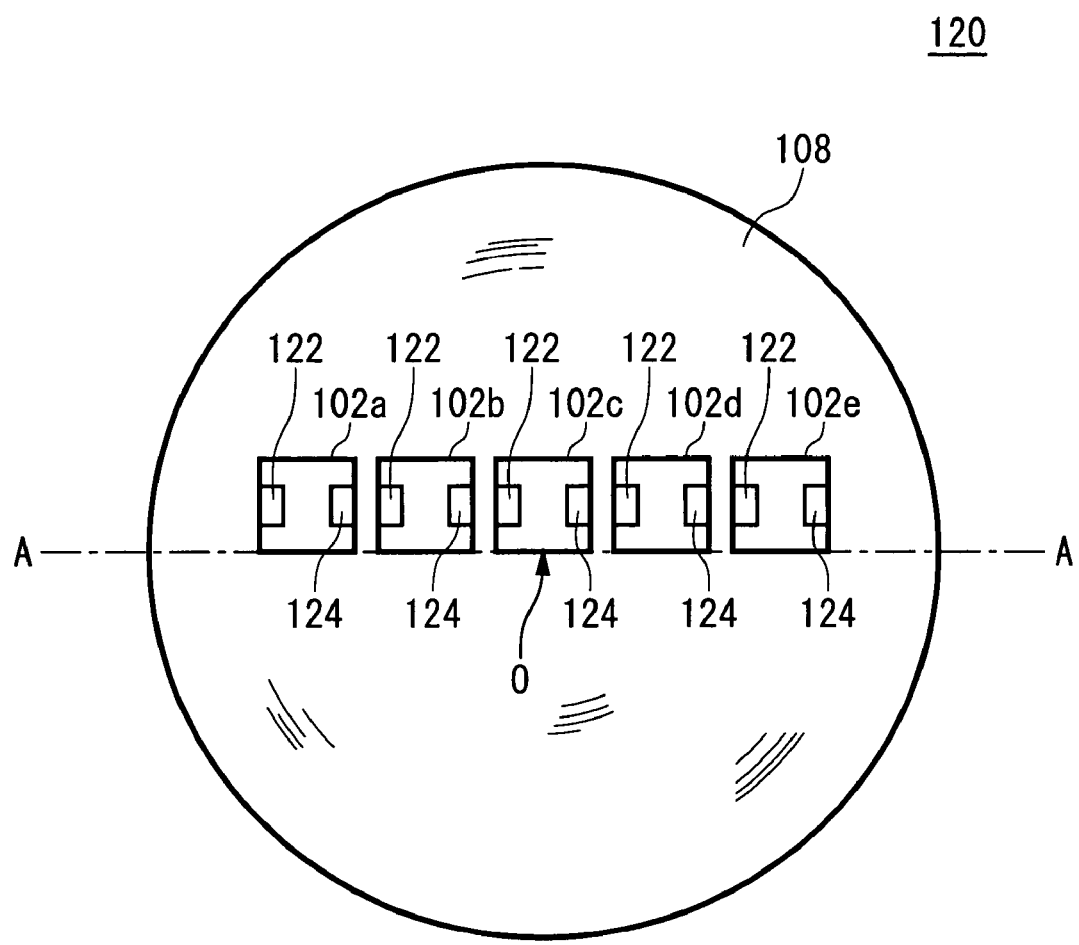
FIG. 7 is a top view of another exemplary light source.
Figure 8:
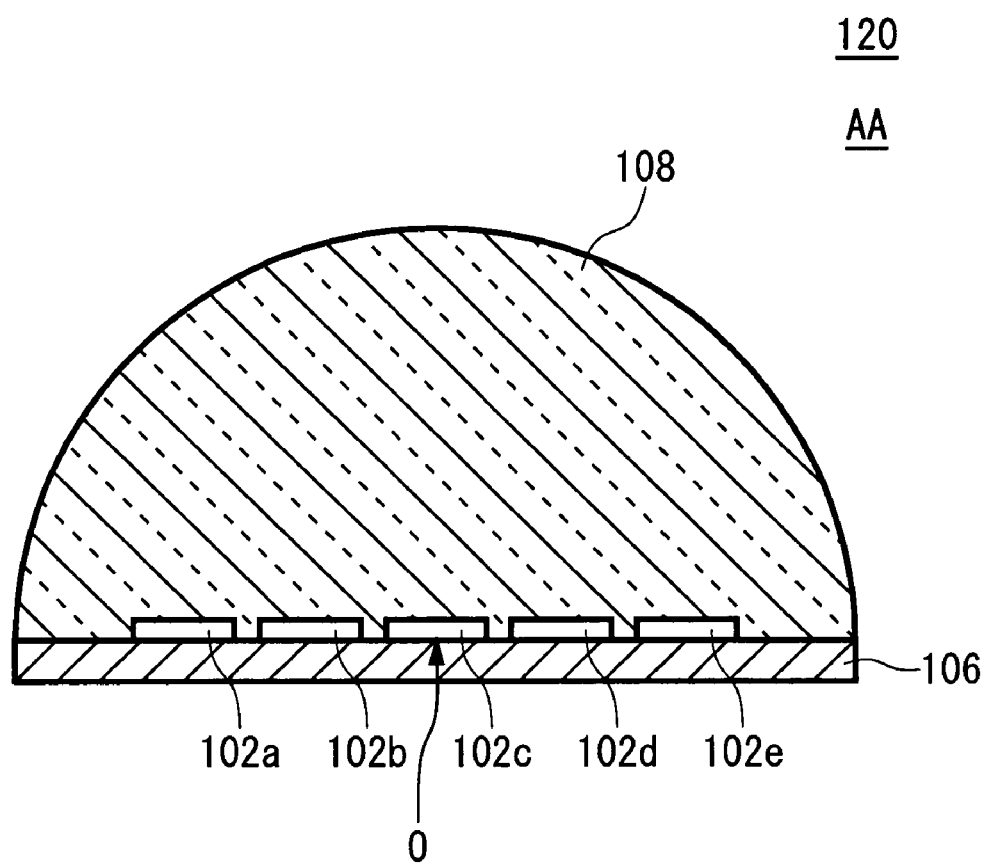
FIG. 8 is a cross-sectional view of the light source shown in FIG. 7, taken along A—A line in FIG. 7.

FIGS. 7 and 8 illustrate another exemplary structure of the light source 120 in detail. FIG. 7 shows the light source 120 seen from above, while FIG. 8 shows a cross section of the light source 120 taken along line A—A in FIG. 7.

In this example, the substrate 106 is a disc. A plurality of semiconductor light emitting devices 102a–102e are approximately aligned in such a manner the sides of them are aligned on the virtual line A—A passing through the center of the circle formed by the outer periphery of the upper surface of the substrate 106, as shown in FIG. 7.

The light transmitting member 108 has an approximately hemispherical shape having its center at the center O of the aforementioned circle. One side of one of the semiconductor light emitting devices 102a–102e positioned at the center of them, i.e., the semiconductor light emitting device 102c is placed on the center O of the aforementioned circle. In this case, the semiconductor light emitting device 102c irradiates light generated by a portion near that side on the center O at such an angle with respect to the surface of the light transmitting member 108 that total reflection of that light does not occur. Therefore, the light transmitting member 108 can irradiate the light emitted by the semiconductor light emitting device 102 pass to the outside efficiently. Except for the above, the components in FIGS. 7 and 8 having the same reference numerals as those in FIG. 4 have the same or similar functions as/to the components in FIG. 4 and therefore the description thereof is omitted.

Figure 9:
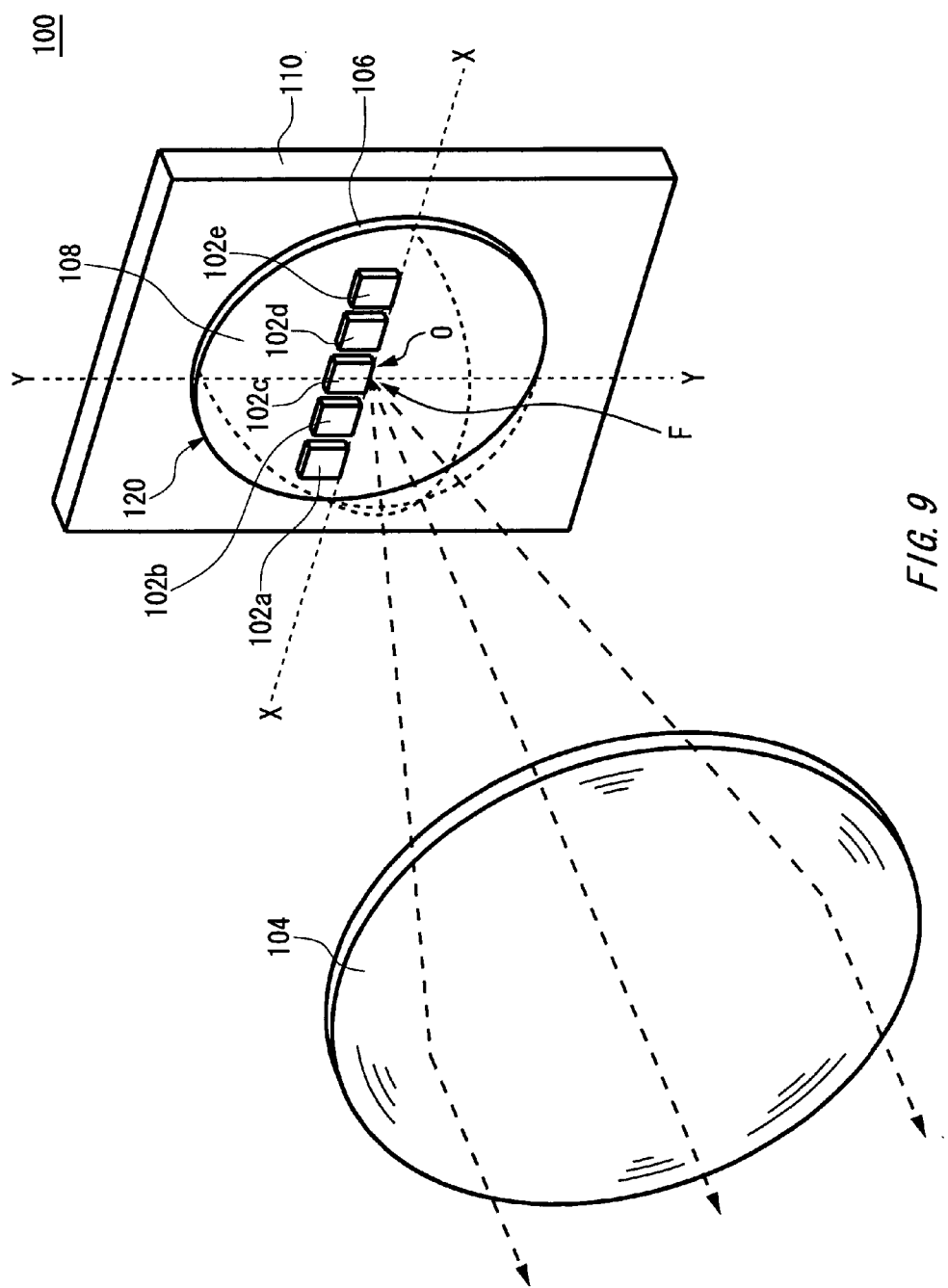
FIG. 9 is a perspective view of another exemplary light source unit.
Figure 10:
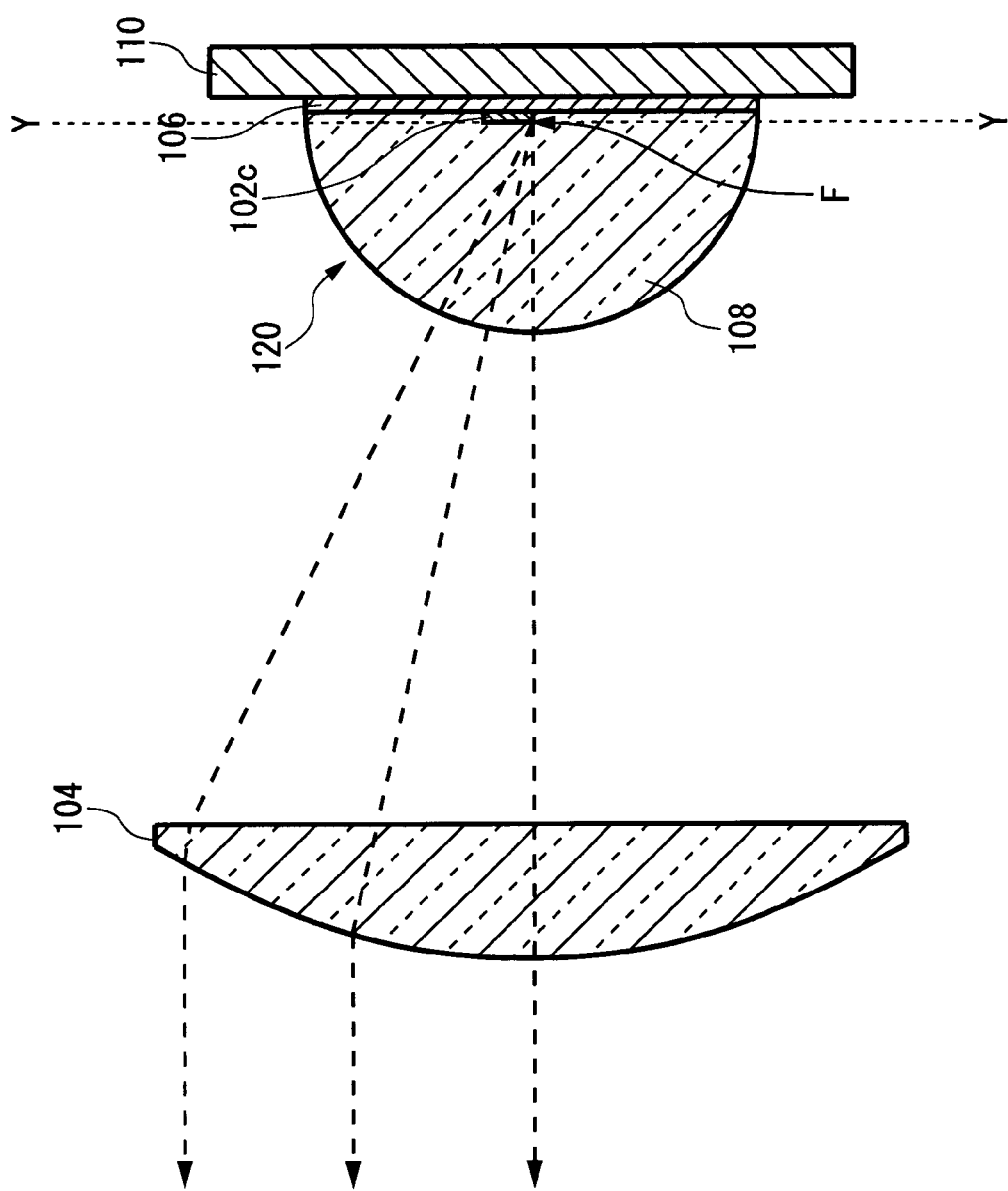
FIG. 10 is a cross-sectional view of the light source unit shown in FIG. 9.

FIGS. 9 and 10 illustrate another exemplary structure of the light source unit 100. FIG. 9 is a perspective view of the light source unit 100, while FIG. 10 is a cross-sectional view thereof taken along a vertical cross section parallel to the front-rear direction of the automobile. In this example, the light source unit 100 makes light emitted by a plurality of semiconductor light emitting devices 102a–102e incident directly on the lens 104 without using the light blocking member 112 (see FIG. 2).

The light source 120 has the same or similar function as/to that shown in FIGS. 7 and 8. A plurality of semiconductor light emitting devices 102a–102e are fixed on the substrate 106 in such a manner their sides aligned on the virtual line A—A (see FIG. 7) are positioned at the lower ends, as shown in FIG. 9. The light source 120 may have the same or similar function and structure as/to the light source 120 shown in FIG. 4.

The lens 104 has its optical center F on the side at the lower end of the semiconductor light emitting device 102c, as shown in FIGS. 9 and 10. In this example, the lens 104 has its optical center F on the intersection of X-axis and Y-axis both running through the center of that side at the lower end of the semiconductor light emitting device 102c, X-axis extending in the transverse direction of the automobile while Y-axis extending vertically. In this case, the lens 104 forms at least a part of the cut line in the light distribution pattern by projecting an image of a portion near that side of the semiconductor light emitting device 102c.

The light source unit 100 of this example forms a light distribution pattern that is similar to at least a part of the light distribution pattern 302 shown in FIG. 5. The lens 104 irradiates light emitted by the semiconductor light emitting device 102c to a region 304 that is a part of the light distribution pattern 302. In this case, the lens 104 forms a boundary 306 of the region 304 on the cut line in the light distribution pattern 302 in accordance with the side at the lower end of the semiconductor light emitting device 102c. The lens 104 may form the boundary 306 by projecting the light emitted by the semiconductor light emitting device 102c from an end face that contains that side.

According to this example, it is possible to form an appropriate light distribution pattern. The automotive lamp 400 (see FIG. 1) may form the light distribution pattern 302 based on light generated by a plurality of light source units 100 respectively having different light distribution characteristics. Except for the above, the components in FIGS. 9 and 10 having the same reference numerals as those in FIGS. 2 and 3 have the same or similar functions as the components in FIGS. 2 and 3 and therefore the description thereof is omitted.

Figure 11:
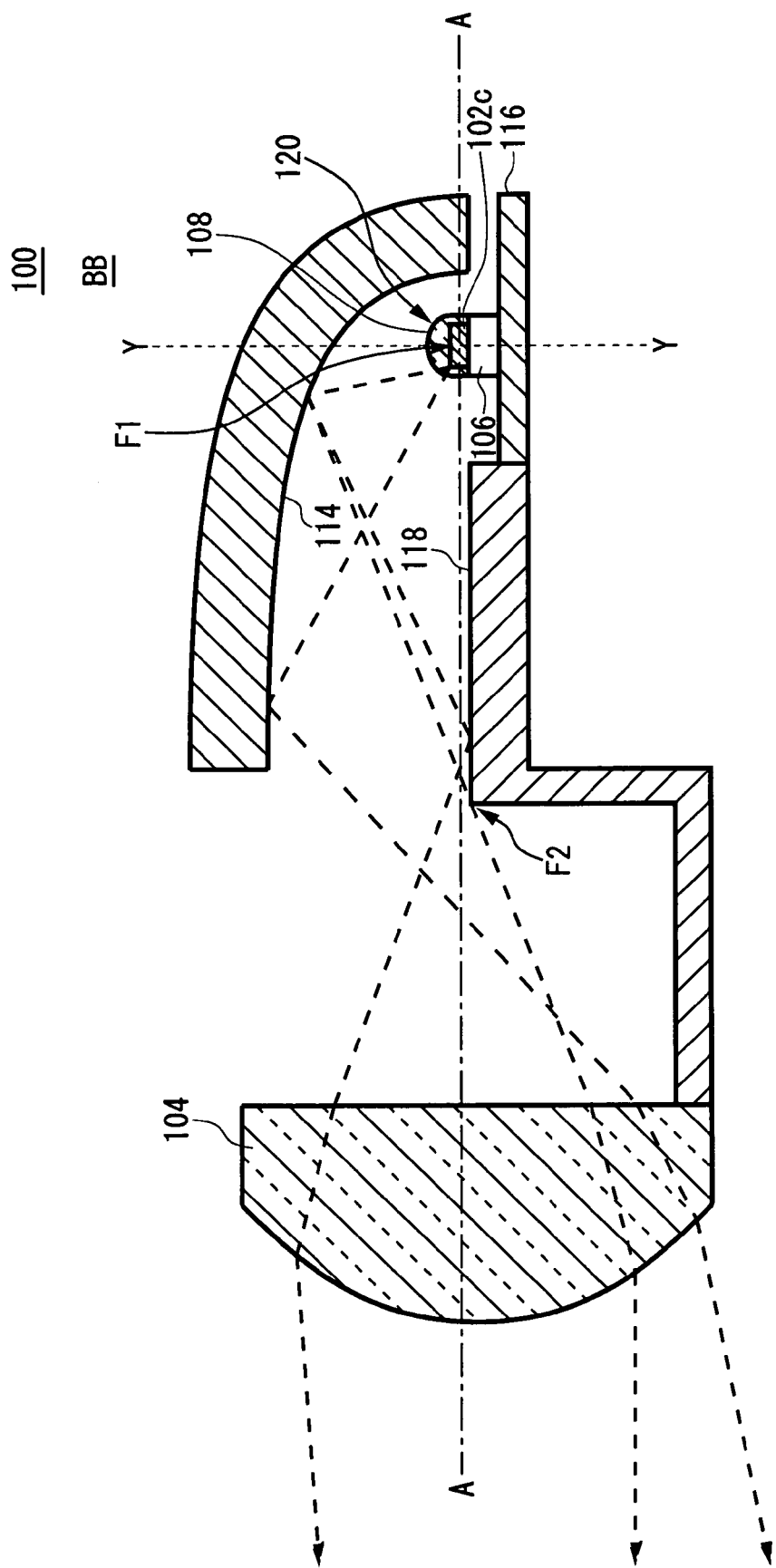
FIG. 11 is a cross-sectional view of another exemplary light source unit, taken along a vertical plane thereof.
Figure 12:
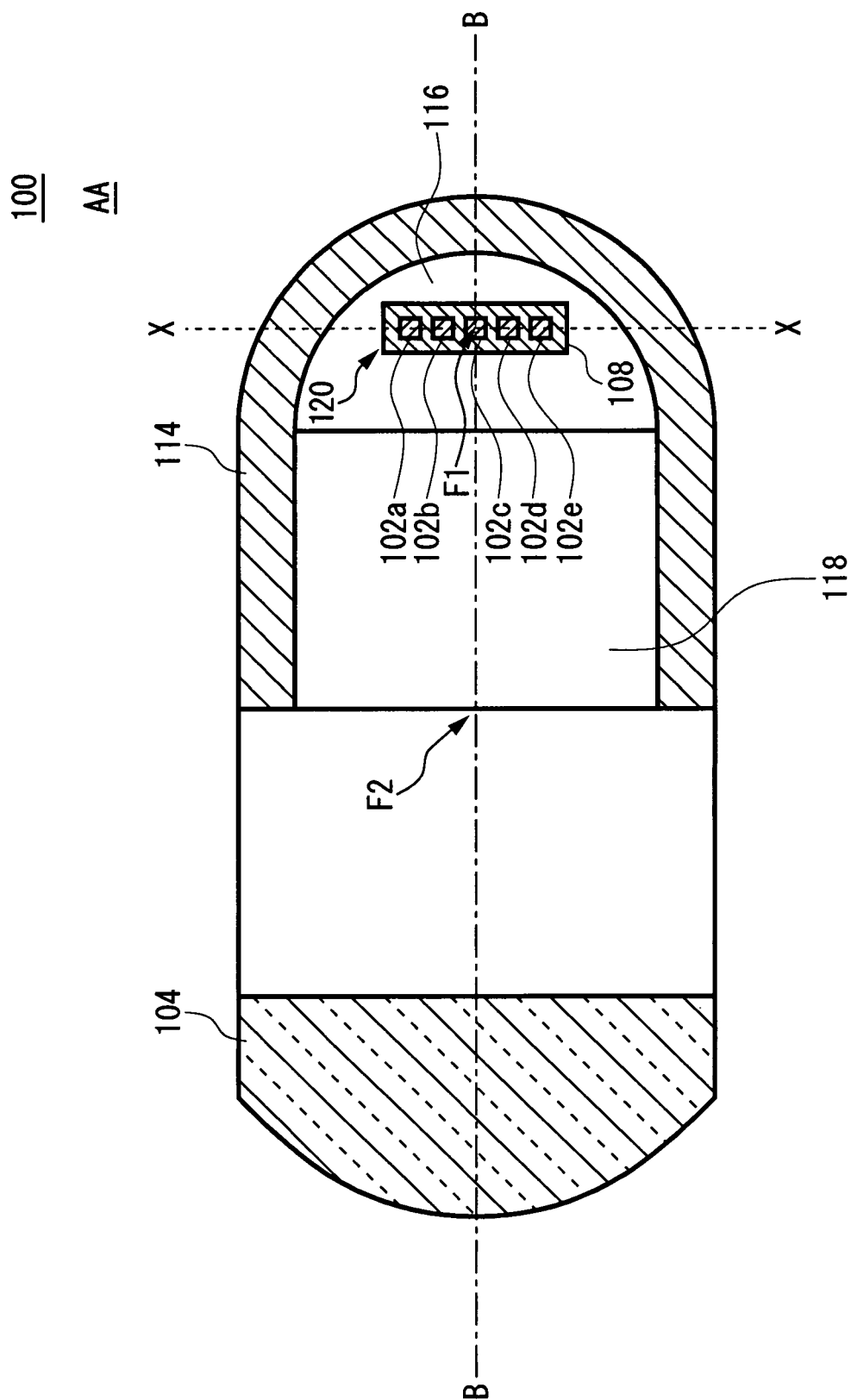
FIG. 12 is a cross-sectional view of the light source unit, taken along a horizontal plane thereof.

FIGS. 11 and 12 illustrate another exemplary structure of the light source unit 100. FIGS. 11 and 12 are cross-sectional views of the light source unit 100 taken along a B—B vertical plane and an A—A horizontal plane, respectively. The light source unit 100 of this example is a projector-type light source unit that emits light reflected and converged at a position near the optical axis, ahead via a lens. The light source unit 100 includes a supporting member 116, a light source 120, a reflecting mirror 118, a lens 104 and another reflecting mirror 114.

The supporting member 116 is a plate having an upper surface arranged approximately horizontally, and fixes the bottom surface of the light source 120 placed on the upper surface thereof. The light source 120 includes a plurality of semiconductor light emitting devices 102a–102e and is fixed on the upper surface of the supporting member 116 to face up. The light source 120 may have the same or similar function as the light source 120 shown in FIG. 4. The semiconductor light emitting devices 102a–102e have sides extending in the approximately transverse direction of the automobile at their front and rear ends. Alternatively, the light source 120 may have the same or similar function as the light source 120 shown in FIGS. 7 and 8.

The reflecting mirror 118 reflects light at its upper surface that is arranged substantially horizontally, and is provided between the front end of the supporting member 116 and the lens 104. The reflecting mirror 118 may be provided in a plane substantially containing a plurality of semiconductor light emitting devices 102a–102e. In this case, light generated by the light source 120 can be made incident on the lens 104 efficiently. Moreover, the front edge of the reflecting mirror 118 has an approximately linear shape that extends in the approximately transverse direction of the automobile. This front edge of the reflecting mirror 118 may have a shape in accordance with the cut line to be formed, such as a shape with both ends turned down.

The lens 104 is provided on the automobile-front side of the reflecting mirrors 118 and 114 and transmits light reflected by the reflecting mirror 118 or 114 to direct that light toward the emitting direction ahead of the automobile. In this example, the lens 104 has a focus near the front edge of the reflecting mirror 118 and forms at least a part of the light distribution pattern of the automotive lamp 400 (see FIG. 1) by projecting an image of a focal plane containing the focus of the lens 104 ahead of the automobile. In this case, the lens 104 forms at least a part of the cut line in the light distribution pattern of the automotive lamp 400 based on the shape of the front edge of the reflecting mirror 118.

The reflecting mirror 114 is an exemplary optical component provided commonly to a plurality of semiconductor light emitting diodes 102a–102e and is arranged to surround the light source 120 from behind, above and sides of the light source 120. In this manner, the reflecting mirror 114 reflects light generated by the light source 120 ahead, thereby making that light incident on the lens 104 and then making the lens 104 irradiate that light toward the emitting direction. Thus, the reflecting mirror 114 can irradiate light emitted by a plurality of semiconductor light emitting devices 102a–102e toward the emitting direction.

In this example, at least a part of the reflecting mirror 114 has an approximately spheroidal shape formed by a combined elliptical plane, for example. This approximately spheroidal shape is set in such a manner that a cross section thereof containing the optical axis of the light source unit 100 forms at least a part of an approximately elliptical shape. The eccentricity of that approximately elliptical shape is set to gradually increase from that in the vertical cross section to that in the horizontal cross section. In addition, the light source unit 100 has the optical axis that runs approximately through the center of the lens 104 to go ahead of the automobile.

The approximately spheroidal part of the reflecting mirror 114 has a focus F1, that is an exemplary optical center, near the one of the semiconductor light emitting devices 102a–102e positioned at the center of them, i.e., the semiconductor light emitting device 102c and also has a focus F2 near the front end of the reflecting mirror 118. In this example, that approximately spheroidal part has its optical center F on the intersection of X-axis and Y-axis both passing through the center of the surface of the semiconductor light emitting device 102c, X-axis extending in the transverse direction of the automobile while Y-axis extending vertically. In this case, that approximately spheroidal part converges at least most of the light generated by the light source 120 at a position near the front edge of the reflecting mirror 118.

In this case, a clear boundary between a bright region and a dark region base on the shape of the front edge of the reflecting mirror 118 is formed near that front edge. Therefore, the lens 104 having its focus near that front edge can irradiate light having the clear boundary between the bright and dark regions to a region near the cut line in the light distribution pattern. Thus, according to this example, it is possible to appropriately form the light distribution pattern having the clear cut line.

The approximately spheroidal part of the reflecting mirror 114 may have the focus F1 near the side at the front end of the semiconductor light emitting device 102c. In this case, that approximately spheroidal part makes at least most of the light emitted by the semiconductor light emitting devices 102a–102e incident directly on the lens 104 without making it incident on the reflecting mirror 118. Therefore, it is possible to irradiate the region near the cut line with light more appropriately.

In another example, the reflecting mirror 114 may be a parabolic reflecting mirror having its focus near the semiconductor light emitting device 102c. In this case, the light source unit 100 may be a parabolic light source unit that emits light ahead by using a parabolic reflecting mirror. Such a light source unit 100 has a transparent cover in place of the lens 104. In this case, the light source unit 100 can emit light controlled with high precision ahead.

As is apparent from the above description, according to the present invention, it is possible to appropriately form a light distribution pattern.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular headlamp for emitting light toward a predetermined emitting direction, comprising:
    a linear light source including a plurality of semiconductor light emitting devices approximately aligned; and
    an optical component provided commonly to said plurality of semiconductor light emitting devices, having its focus on one of said plurality of semiconductor light emitting devices, operable to irradiate light emitted by said plurality of semiconductor light emitting devices toward said emitting direction, wherein
    the focus of the optical component is on a focal point, and
    the focal point is located on a surface of the one of the plurality of semiconductor light emitting devices that is positioned at the center of the plurality of semiconductor light emitting devices.

2. A vehicular headlamp as claimed in claim 1, wherein an odd number of semiconductor light emitting devices are provided.

3. A vehicular headlamp as claimed in claim 1, wherein
    said vehicular headlamp emits said light ahead of an automobile, and
    said plurality of semiconductor light emitting devices are aligned in an approximately transverse direction of the automobile.

4. A vehicular headlamp for emitting light toward a predetermined emitting direction, comprising:
    a linear light source including a plurality of semiconductor light emitting devices approximately aligned; and
    an optical component provided commonly to said plurality of semiconductor light emitting devices, having its focus on one of said plurality of semiconductor light emitting devices, operable to irradiate light emitted by said plurality of semiconductor light emitting devices toward said emitting direction, wherein
    said plurality of semiconductor light emitting devices are aligned in a predetermined aligning direction;
    said one semiconductor light emitting device has a side at an end thereof, said side extending in said aligning direction; and
    said optical component has said focal point on said side and forms at least a part of a cut line for defining a boundary between a bright region and a dark region in a light distribution pattern of said vehicular headlamp based on light emitted by a portion near said side of said one semiconductor light emitting device.

5. A vehicular headlamp as claimed in claim 4, wherein
    said vehicular headlamp emits said light ahead of an automobile, and
    said plurality of semiconductor light emitting devices are aligned in an approximately transverse direction of the automobile.

6. A vehicular headlamp for emitting light toward a predetermined emitting direction, comprising:
    a plurality of semiconductor light emitting devices approximately aligned;
    an optical component comprising a reflecting mirror surrounding at least one direction of said semiconductor light emitting devices, said reflecting mirror comprising at least in part thereof an elliptical plane, and said reflecting mirror having a focus on one of said plurality of semiconductor light emitting devices, operable to irradiate light emitted by said plurality of semiconductor light emitting devices toward said emitting direction, wherein
    the focus of the reflecting mirror is on a focal point, and
    the focal point is located on a surface one of the plurality of semiconductor light emitting devices that is positioned at the center of the plurality of semiconductor light emitting devices.

* * * * *